United States Patent [19]

Araseki et al.

[11] 4,354,273

[45] Oct. 12, 1982

[54] ADPCM SYSTEM FOR SPEECH OR LIKE SIGNALS

[75] Inventors: Takashi Araseki; Kazunori Ozawa, both of Tokyo, Japan

[73] Assignee: Nippon Electric Company, Ltd., Tokyo, Japan

[21] Appl. No.: 156,990

[22] Filed: Jun. 9, 1980

[30] Foreign Application Priority Data

Jun. 12, 1979 [JP] Japan .................................. 54-74122
Jun. 12, 1979 [JP] Japan .................................. 54-74123

[51] Int. Cl.³ ............................................. H04B 15/00
[52] U.S. Cl. ..................................... 375/27; 329/107; 332/11 D; 375/60
[58] Field of Search ...................... 375/27, 34, 26, 60, 375/58; 332/11 D; 329/107

[56] References Cited

U.S. PATENT DOCUMENTS

| | | | |
|---|---|---|---|
| 3,502,986 | 3/1970 | Lucky | 375/34 |
| 3,931,596 | 1/1976 | Gersho et al. | 332/11 D |
| 3,973,199 | 8/1976 | Widmer | 375/26 |

OTHER PUBLICATIONS

Cohn, D. L. et al., "The Residual Encoder-An Improved ADPCM System for Speech Digitization" *IEEE Trans. on Comm.*, vol. COM-23, No. 9, pp. 935-941, Sep. 1970.

Jayant, "Adaptive Quantization . . . One-Word Memory" *Bell Sys. Tech. Journal*, vol. 52, No. 7, pp. 1119-1144. Sep. 1973.

Mick, *Digital Signal Processing Handbook*, p. 47, Adv. Micro Devices, Inc. Sunnyvale, CA. 1976.

*Primary Examiner*—Glen R. Swann, III
*Attorney, Agent, or Firm*—Sughrue, Mion, Zinn, Macpeak and Seas

[57] ABSTRACT

In an adaptive differential pulse code modulation (ADPCM) system for frequency band compression of speech or like signals, the coefficient of the synthesis filter in both the transmitter and receiver is varied in accordance with the normalized error $e_j/\Delta$ rather than the error itself, thus providing greater frequency band compression and preventing transmission errors from rendering the synthesis filter unstable.

9 Claims, 9 Drawing Figures

ADPCM SYSTEM FOR SPEECH OR LIKE SIGNALS

BACKGROUND OF THE INVENTION

The present invention relates to an improvement in an adaptive differential pulse code modulation (ADPCM) system for the frequency band compression of speech or like signals.

Various techniques have been developed to transmit or store speech signals in compressed form utilizing the redundancy of a speech signal. A differential pulse code modulation (DPCM) system achieves such band compression by making use of the characteristics of the speech signal. This is based on the fact that speech signal samples have a close correlation with each other. More specifically, the prediction of the amplitude of each sample of the speech signal at a given point in time can be made on the basis of the past speech signal sample. The simplest DPCM method uses as a predicted value a sample immediately preceding the present sample or the product of that preceding sample and a value slightly smaller than 1, and transmits or stores only the prediction error signal resulting from the subtraction of the predicted value from the true amplitude. The original signal can be reproduced by similarly producing a predicted value and adding to it the prediction error signal in the reproduction unit. The compression of speech signals by this DPCM system improves the signal to noise (S/N) ratio by about 6 dB (decibel) over a PCM system using the same number of bits. For the same S/N ratio, a DPCM system can save about one bit per sample as compared to a PCM system.

Compression efficiency can be further raised by using a plurality of past samples for the prediction instead of only one, thus enabling more accurate prediction. Prediction accuracy can also be improved by adapting the prediction method to the characteristics of the particular signal to be predicted. To be more specific, a predicted value $\hat{X}_j$ of a speech signal having an amplitude $X_j$ at a time point j is represented by:

$$\hat{X}_j = A_1 X_{j-1} + A_2 X_{j-2} + \ldots + A_n X_{j-n}$$

where $A_1, A_2, \ldots A_n$ are the coefficients of a prediction filter. Adaptive prediction means the optimum selection of these prediction filter coefficients for the speech signal to be predicted.

The method for obtaining the prediction coefficients can be broadly classified into two categories: one is to analyze a speech signal for the optimum prediction coefficients, and the other is to observe the prediction error signal and adaptively correct the prediction coefficients so as to reduce the prediction error signal. While the former requires transmission of both the quantized signal and the prediction coefficients obtained from the speech signal analysis, the latter needs no transmission of the prediction coefficients. Accordingly, the latter results in a simpler circuit construction.

For details of an ADPCM system using this method, reference is made to a paper by David L. Cohn et al, entitled "The Residual Encoder—An Improved ADPCM System for Speech Digitization", IEEE Transactions on Communications, Vol. COM-23, No. 9, September issue, 1975, pp. 935-941 (hereinafter referred to as Reference 1). However, this ADPCM system, which is vulnerable to transmission errors, needs additional hardware to eliminate said errors at the sacrifice of the S/N ratio, resulting in a larger and more expensive system.

SUMMARY OF THE INVENTION

One object of this invention, therefore, is to provide a simplified ADPCM system capable of achieving greater frequency band compression.

According to this invention, there is provided an ADPCM system which comprises a transmitter, said transmitter including a subtractor for obtaining the difference between an input signal and a predicted value, an adaptive quantizer for dividing the output of said subtractor by a normalization coefficient which adaptively varies and for supplying as an output the quotient of said division in coded form, an adaptive inverse quantizer for decoding the output of said adaptive quantizer and for multiplying said decoded output by the normalization coefficient, and an adaptive predictor having a digital filter for providing said predicted value in response to the output of the inverse quantizer and for correcting the coefficient of said digital filter by the use of the output of the adaptive quantizer or the result decoded by said inverse quantizer; said system further comprising a receiver which includes an adaptive inverse quantizer for decoding the output of said transmitter and for multiplying said decoded output by an adaptively varying normalization coefficient, and an adaptive predictor having a digital filter for providing a predicted value in response to the output of the inverse quantizer and for correcting the coefficient of said digital filter by the use of the output of the adaptive quantizer or the result decoded by said inverse quantizer; said system further comprising a receiver which includes an adaptive inverse quantizer for decoding the output of said transmitter and for multiplying said decoded output by an adaptively varying normalization coefficient, and an adaptive predictor having a digital filter for providing a predicted value in response to the output of the inverse quantizer of the receiver and for correcting the coefficient of said digital filter by the use of the output of the transmitter or the result decoded by said inverse quantizer.

Other advantages and features of the invention will be apparent from the following detailed description taken in conjunction with the accompanying drawings, wherein:

DETAILED DESCRIPTION OF THE PREFERRED EMBODIMENTS

In the accompanying drawings, the same structural elements are designated by like reference numerals. It is also assumed that each signal path carries a plurality of bits in parallel. Structural elements of the receiver corresponding to those in the transmitter are depicted by the identical reference numerals with primes.

Figure 1:
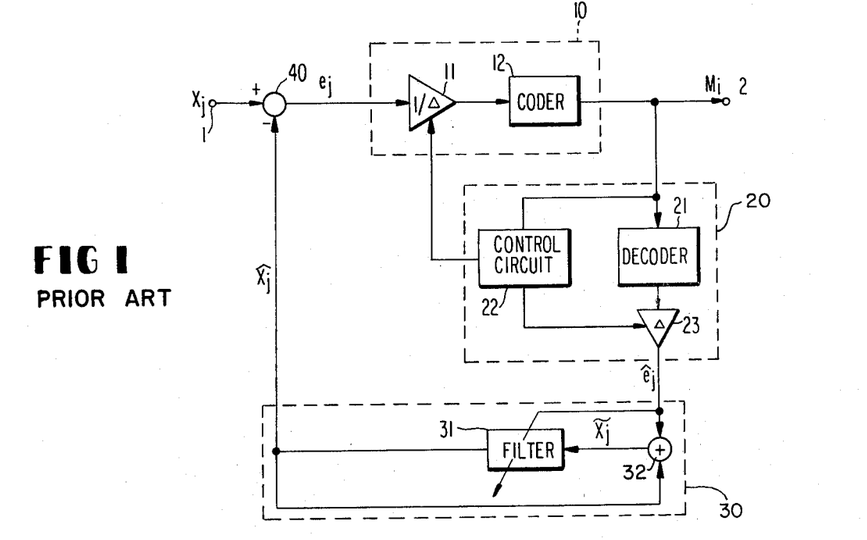
FIGS. 1 and 2 are block diagrams illustrating a prior art ADPCM system.
Figure 2:
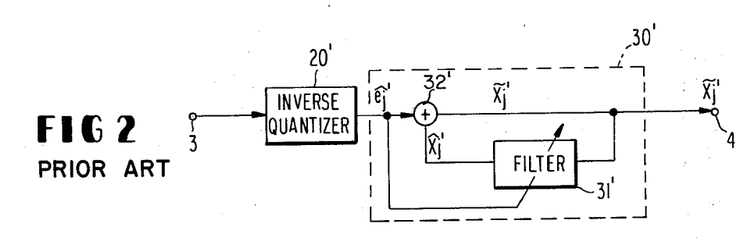

FIGS. 1 and 2 respectively illustrate the transmitter and the receiver of the prior-art ADPCM system of Reference 1. An adaptive quantizer 10, an adaptive inverse quantizer 20, and a digital filter 31 shown in FIG. 1 correspond to the quantizer, the inverse quantizer, and the predictor, respectively, in FIG. 1(a) of Reference 1. An adaptive inverse quantizer 20′ and a digital filter 31′ shown in FIG. 2 correspond to the inverse quantizer and the predictor, respectively, in FIG. 1(b) of Reference 1. All of the signals handled in this system are preferably digital signals. Therefore, input speech signals are digital signals which are obtained by sampling and analog-to-digital (A/D) converting by an A/D converter (not illustrated). The suffix j attached to each signal sample referred to indicates the sampling time point. Analog signals may be handled instead, in which case the A/D converter would not be needed.

Referring to FIG. 1, a digitized speech signal is supplied to a terminal 1 and a predicted value $\hat{X}_j$ is produced by an adaptive predictor 30. A subtractor 40 performs the operation $e_j = X_j - \hat{X}_j$ to obtain a prediction error $e_j$, which is then quantized by the adaptive quantizer 10. As will be discussed below, a normalization coefficient $\Delta$, which is a value close to the root mean square (rms) value of the prediction error $e_j$, is provided to divider 11 from control circuit 22 of the adaptive inverse quantizer 20, and the divider 11 divides the prediction error $e_j$ by $\Delta$, thereby accomplishing amplitude normalization, and a coder 12 encodes the normalized signal. The structure of FIG. 2 will be described hereunder in more detail.

Figure 3A:
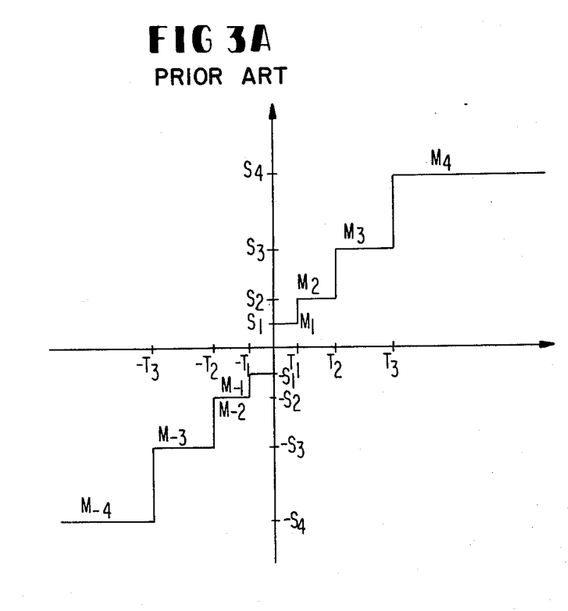
FIG. 3A illustrates the input and output characteristics of the coder and decoder shown in FIG. 1.

FIG. 3A illustrates the input and output characteristics of the coder 12 and a decoder 21. For the coder 12, the input is represented by the abscissa, and the output by $M_i$ (i=1, 2, −2, ..., −4). For instance, if the input to the coder 12 lies between $T_1$ and $T_2$, the output of the coder 12 becomes $M_2$. Each of the $M_i$ is composed of a predetermined sequence of bits and is supplied to the adaptive inverse quantizer 20. The decoder 21 receives the $M_i$ as input signals and supplies $\pm S_k$ (k=1, 2 ..., 4) as an output. For example, if the input is $M_2$, the output becomes $S_2$. The output of the decoder 21 is fed to a multiplier 23 and multiplied by the normalization coefficient $\Delta$, and the normalized signal from the multiplier 23 is represented by $\hat{e}_j$. Although eight different states of $\pm S_k$ or $M_i$ are assumed in FIG. 3A, it should be appreciated that the prediction error $e_j$ and the decoded signal $\hat{e}_j$ will be identical with each other if the number of the states to be assumed is infinitely fine.

This adaptive quantization method is used for handling speech signals with very wide dynamic range. On the other hand, a fixed quantization method, which does not perform the amplitude normalization, cannot achieve sufficiently high quality quantization of such a speech signal. Dividing a prediction error $e_j$ by the normalization coefficient $\Delta$, which is close to the rms value of the prediction error $e_j$, always results in a value close to 1. Consequently, the coder 12 and decoder 21 are simplified.

Figure 3B:
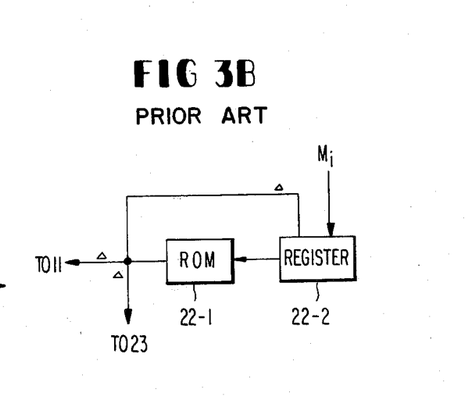
FIG. 3B illustrates a control circuit used in the system of FIG. 1.

The calculation of $\Delta$ is accomplished by the control circuit 22 shown in FIG. 3B. In response to $M_i$ (i=1, −1, 2, ..., 4) supplied to the control circuit 22, a multiplier m is produced based on Table 1.

TABLE 1

| $M_i$ | m |
| --- | --- |
| $M_1, M_{-1}$ | 0.8 |
| $M_2, M_{-2}$ | 0.8 |
| $M_3, M_{-3}$ | 1.2 |
| $M_4, M_{-4}$ | 2.0 |

Also, $\Delta$, is altered at each sampling time point in accordance with $\Delta = \Delta \times m$, which means a new $\Delta$ is provided by multiplying a prior $\Delta$ by m at a given time point j. According to this formula, in the presence of a large prediction error $e_j$, m>1 results in an increase of $\Delta$, and in the presence of a small prediction error, m<1 results in a decrease of $\Delta$. Thus, $\Delta$ follows the variation of the prediction error $e_j$. Details of the selection of the input and output characteristics of the coder 12 and the decoder 21 are described in a paper by N. S. Jayant, entitled "Adaptive Quantization with a One-Word Memory", The Bell System Technical Journal, September issue, 1973, pp. 1119–1144 (hereinafter referred to as Reference 2). The decoded signal $\hat{e}_j$ thereby obtained is sent to the adaptive predictor 30, wherein an adder 32 first calculates $$\tilde{X}_j = \hat{X}_j + \hat{e}_j.$$

If no quantization is effected, i.e. with an infinite number of levels $M_i$, the signal $\tilde{X}_j$ will be identical with the input signal $X_j$. A filter 31 gives the predicted value $\hat{X}_j$ depending on the following equation:

$$\hat{X}_j = A_1 \tilde{X}_{j-1} + A_2 \tilde{X}_{j-2} + \ldots + A_n \tilde{X}_{j-n}.$$

In an adaptive prediction system, the filter coefficients $A_1, A_2, \ldots, A_n$ are adaptively corrected depending on the characteristics of the input speech signals. The following two are typical among relatively simple and highly adaptive algorithms for this correction:

$$A_i = A_i + g\,\hat{e}_j \cdot \tilde{X}_{j-i} / \sum_{i=1}^{n} (\tilde{X}_{j-i})^2 \quad (1)$$

and $$A_i = A_i + g\,\hat{e}_j \cdot \text{sign}\,(\tilde{X}_{j-i}) / \sum_{i=1}^{n} \tilde{X}_{j-i} \quad (2)$$

These formulas mean that the second term on the right side is added to a first $A_i$ to make a new $A_i$, and calculations are performed assuming i equals 1, 2, ..., n.

As used herein, g stands for the correction gain, and sign $(\tilde{X}_j)$ takes on a value of +1 or −1 depending on the polarity of $\tilde{X}_j$.

The algorithms are generally satisfactory in performance except that they involve a considerable number of operations. Namely, in the latter of the two algorithms, since $\tilde{X}_{j-i}$ is converted into either +1 or −1, $$G = g\,\hat{e}_j / \sum_{i=i}^{n} \tilde{X}_{j-1}$$

is calculated once per sample, and the correction of the coefficient only requires addition or subtraction of G according to the polarity of $\tilde{X}_{j-i}$. As a result, this algorithm considerably reduces the number of operations necessary, but a large number of operations are still needed to calculate G.

Referring again to FIG. 2 which illustrates the receiver, a bit sequence $M_i(i=1, -1, \ldots, 4)$ produced by the adaptive quantizer 10 is received at a terminal 3. The inverse quantizer 20' and an adaptive predictor 30' with a digital filter 31' have exactly the same structures as the inverse quantizer 20 and adaptive predictor 30, respectively, of the transmitter, and a reproduced signal $\tilde{X}_j'$ is obtained by adding $\hat{X}_j'$ and $\hat{e}_j'$ in adder 32'.

As is evident from the foregoing, the prior-art ADPCM system using the above-described adaptive prediction method has a complicated structure due to the large number of operations involved.

Figure 4:
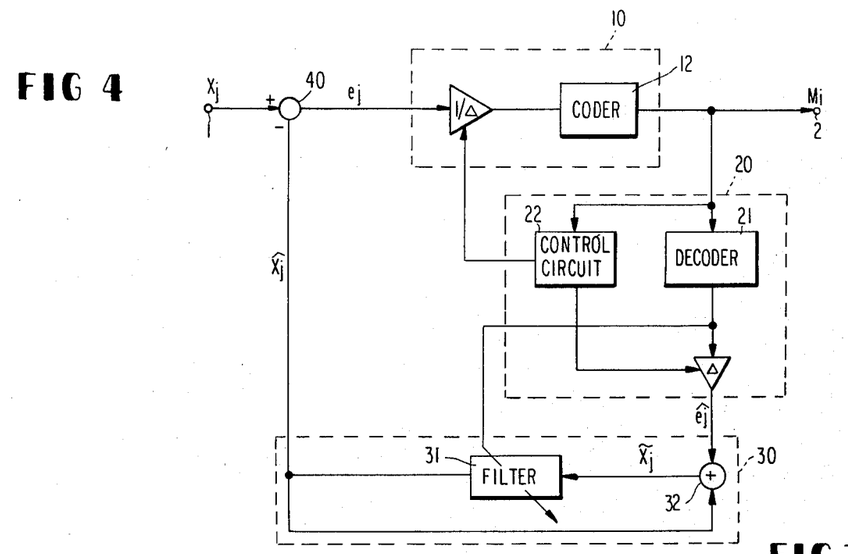
FIG. 4 is a block diagram of a transmitter for use in a first embodiment of this invention.
Figure 5:
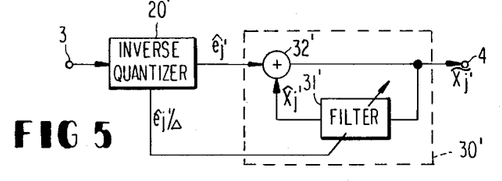
FIG. 5 is a block diagram of a receiver for use in the embodiment of FIG. 4.

FIGS. 4 and 5 are block diagrams illustrating a first embodiment of the present invention. The adaptive quantization and inverse quantization methods used in this embodiment are approximately the same as those illustrated in FIGS. 1 and 2. The only major difference between them, which lies in the parts related to adaptive prediction, will be described hereunder primarily with reference to the adaptive predictor 30.

A significant feature of this embodiment lies in the filter coefficient correction algorithm. The correction algorithm is given by the following equation:

$$A_i = A_i + g'\,(\hat{e}_j/\Delta)\,\text{sign}\,(\tilde{X}_{j-i}) \tag{3}$$

where g' is the correction gain; i, an integer ranging from 1 to n; and $\Delta$, the normalization coefficient. In this equation, $(\hat{e}_j/\Delta)$ is the output of the decoder 21. The use of this algorithm makes it possible to complete the correction of the filter by multiplying the output of the decoder 21 by the correction gain g' and adding to or subtracting from the filter coefficient the product of the multiplication depending on the polarity (or sign) of $\tilde{X}_{j-i}$. Assuming that the correction gain g' is a constant value which is a power of 2, multiplication by g' can be achieved merely by appropriate wiring of the circuit. Consequently, for multiplication by g' no actual operation is needed.

Next, it will be shown that equation (3) is approximately equal to equation (2). Since $\Delta$ is close to the rms value of the prediction error $e_j$, it is approximately equal to the average of the absolute value of $e_j$. Therefore, if the average absolute value of $e_j$ is represented by $\bar{e}$, $\Delta \cong \bar{e}$. Furthermore, if the average value of the input speech signal $X_j$ is represented by $\bar{X}$, $$\sum_{i=1}^{n} |X_{j-i}|$$

is approximately equal to $n \cdot \bar{X}$. Therefore, equation (3) can be developed as follows:

$$A_i = A_i + g' \cdot (\hat{e}_j/\bar{e})\,\text{sign}\,(\tilde{X}_{j-i}) \tag{4}$$

-continued
$$= A_i + (g'n \cdot \bar{X}/\bar{e}) \cdot \hat{e}_j \cdot \text{sign}\,(\tilde{X}_{j-1}) / \sum_{i=1}^{n} |X_{j-i}|.$$

In the speech signal, $\bar{X}/\bar{e}$ generally ranges between 3 and 4. Accordingly, if g' is assumed to equal g/3n, equation (4) will be approximately identical with equation (2).

For the foregoing reasons, the use of equation (3) as the filter coefficient correction algorithm helps realize the present ADPCM system, which performs only a few operations to give high performance. In the receiver illustrated in FIG. 5, similar operations are performed by its structural elements 20' and 30' respectively corresponding to the adaptive inverse quantizer 20 and the adaptive predictor 30 of the transmitter shown in FIG. 4.

Figure 6:
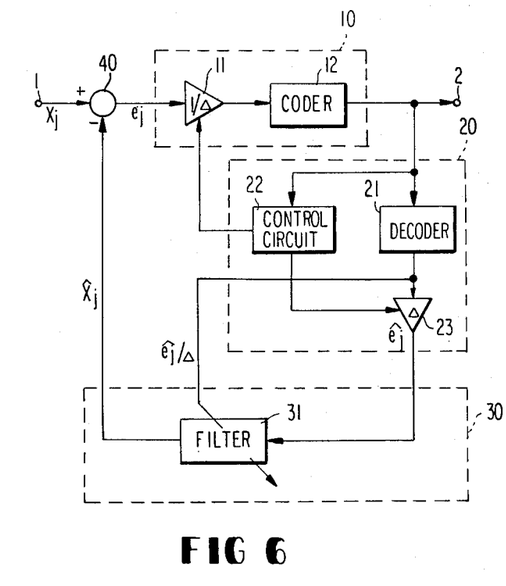
FIG. 6, is a block diagram of a transmitter for use in a second embodiment of the present invention.
Figure 7:
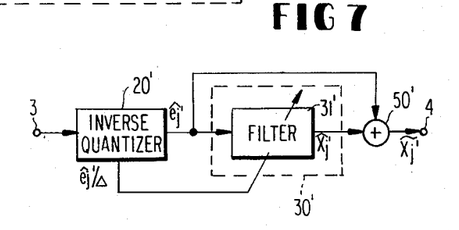
FIG. 7 is a block diagram of a receiver for use in the second embodiment of FIG. 6.

FIGS. 6 and 7 illustrate a second embodiment of the present invention. In the first embodiment of FIG. 4 as well as in the prior art system of FIG. 1, the predicted value $\hat{X}_j$ is produced by a recursive digital filter composed of the digital filter 31 and adder 32. As a result, once errors occur either in the transmission path or in the memory medium (these errors are called "transmission errors" hereunder), the coefficient of the filter 31' of the predictor 30' used in the receiver will become different from that of the filter 31 of the transmitter. This results in instability in operation and deterioration in performance of the system. To eliminate these disadvantages, a nonrecursive filter structure of the adaptive predictor has been developed. Only essential points of this structure will be described here with reference to FIGS. 6 and 7, since details thereon are given by Takashi Araseki et al in copending U.S. Pat. application Ser. No. 79,724 (filed on Sept. 28, 1979). In this second embodiment, unlike in the first one, the adaptive predictor 30 is composed of a nonrecursive filter. Thus, in the filter 31, $$\hat{X}_j = B_1\hat{e}_{j-1} + B_2\hat{e}_{j-2} + \ldots + B_n\hat{e}_{j-n}. \tag{5}$$

Irrespective of whatever occurs to the coefficient, a nonrecursive filter is stable, preventing the performance of the ADPCM system from being deteriorated by such transmission errors. The coefficient in equation (5) is generally corrected corresponding to equation (2), as follows:

$$B_i = B_i + g \cdot \hat{e}_j \cdot \text{sign}\,(\hat{e}_{j-1}) / \sum_{i=1}^{n} |\hat{e}_{j-i}|. \tag{6}$$

For this embodiment, however, $\hat{e}_j/\Delta$ can be used to rewrite equation (6) to:

$$B_i = B_i + g' \cdot (\hat{e}_j/\Delta) \cdot \text{sign}\,(\hat{e}_{j-i}). \tag{7}$$

Since $\Delta = \bar{e}$ according to the denomination used above, equation (7) further be rewritten to:

$$B_i = B_i + g' \cdot \hat{e}_j \cdot \text{sign}\,(\hat{e}_{j-i})/\bar{e} \tag{8}$$

$$= B_i + (g'n) \cdot \hat{e}_j \cdot \text{sign}\,(\hat{e}_{j-i}) / \sum_{i=1}^{n} |\hat{e}_{j-i}|$$

and will become identical with equation (6) if g' is assumed to equal g/n. Therefore, this embodiment merely requires generating $\hat{e}_j/\Delta$ in the adaptive inverse quantizer 20, multiplying it by a proper corrective gain g' and either adding the multiplication to or subtracting it from the filter coefficient depending on the polarity of $e_{j-i}$.

As shown in FIG. 7, the receiver has an inverse quantizer 20' and an adaptive predictor 30', which perform exactly the same operations as the inverse quantizer 20 and the adaptive predictor 30, respectively, of the transmitter of FIG. 6. In the receiver, the reproduced signal $\tilde{X}_j'$ is represented by the following equation:

$$\tilde{X}_j = \hat{e}'_j + \hat{X}_j$$
$$= \hat{e}'_j + B_1\hat{e}_{j-1} + B_2\hat{e}_{j-2} + \ldots + B_n\hat{e}_{j-n}.$$

Therefore, the adaptive predictor of the receiver is a nonrecursive filter, which is not rendered unstable by transmission errors.

Figure 8:
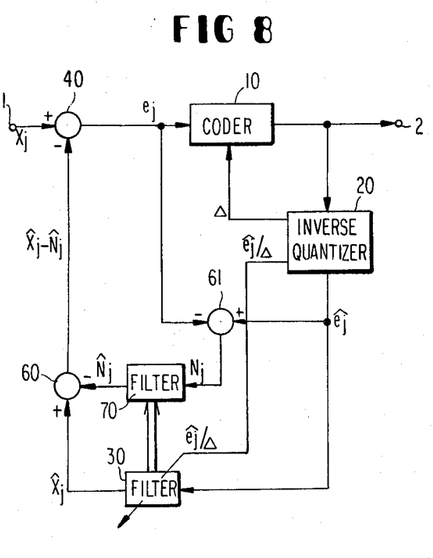
FIG. 8 is a block diagram of a transmitter for use in a third embodiment of the present invention.

FIG. 8 illustrates a third example of a transmitter for use in the present ADPCM system. In this transmitter, subtractors 60 and 61 and a filter 70 are newly added to the transmitter of the second embodiment. The receiver is exactly the same as that used in the second embodiment.

The third embodiment will be described hereunder mainly with respect to its differences from the second embodiment. The difference between the prediction error $e_j$ and the output $\hat{e}_j$ of the inverse quantizer is obtained by the subtractor 61. The output $N_j$ of the subtractor 61, which may be regarded as quantization noise resulting from the quantizing process, is given to the filter 70. The coefficient of the filter 31 in the adaptive predictor 30 is used directly as that of the filter 70. The coefficient of the filter 31 being represented by $B_1$, $B_2$, ... $B_n$, the output $N_j$ of the filter 70 is $$\hat{N}_j = B_1 N_{j-1} + B_2 N_{j-2} + \ldots + B_n N_{j-n}. \quad (9)$$

If there is no error on the transmission path, the signal $\tilde{X}_j'$ reproduced in the receiver will be, because it is the sum of $\hat{e}_j$ and $\hat{X}_j$, $$\tilde{X}_j = \hat{e}_j + \hat{X}_j = e_j + N_j + \hat{X}_j = X_j - \hat{X}_j + \hat{N}_j + N_j + \hat{X}_j \quad (10)$$

$$= X_j + N_j + (B_1 N_{j-1} + B_2 N_{j-2} + \ldots + B_n N_{j-n}).$$

From equation (10), it is noted that $\tilde{X}_j'$ is the sum of the original signal $X_j$ and $N_j$ given through a filter with the characteristic of $(1 + B_1 Z^{-1} + B_2 Z^{-2} + \ldots + B_n Z^{-n})$. As shown in FIG. 7, the digital filter in the receiver, consisting of the adaptive predictor 30' and the adder 50', has the characteristic of $(1 + B_1 Z^{-1} + B_2 Z^{-2} + \ldots + B_n Z^{-N})$, which closely resembles the spectrum of the speech signal. Accordingly, assuming that the spectrum of $N_j$ is flat, the quantization noise component contained in $\tilde{X}_j$ will also be close to the speech spectrum. In the prior-art ADPCM system, where the noise component occurring in quantization is almost white noise, hiss noise is superimposed on the output speech signal of the receiver. Consequently, at low S/N ratios, the quantization noise involving the hiss noise is considerably offensive to the ear. With this embodiment, since the quantization noise, which resembles the speech spectrum, is masked by the speech signal, the cause of the offensive noise is eliminated.

The multiplier 23 of the inverse quantizer 20 and the divider 11 of the quantizer 10, both referred to above, can respectively be composed of a multiplier/divider of the type illustrated in FIG. 6 in p. 47 of *Advanced Micro Devices Digital Signal Processing Handbook* (hereinafter referred to as Reference 3), published in 1976 by Advanced Micro Devices Inc., California, U.S.

Also, the coder 12 of the quantizer 10 and the decoder 21 of the inverse quantizer 20 can be composed of read only memories (ROMs) which, using input signals as addresses, give output signals described in connection with FIG. 3. For details of the ROM, reference is made to 26 in FIG. 5 of U.S. Pat. No. 4,016,368.

Similarly, the control circuit 22 of the inverse quantizer 20, as illustrated in FIG. 3B, may comprise a register 22-1 which stores the normalization coefficient $\Delta$ and ROM 22-2 which, using $\Delta$ as an address, gives a new $\Delta$ ($=\Delta xm$) as its output.

As has been stated above, the present invention enables the manufacture of a simplified ADPCM system which is not rendered unstable by transmission errors, thereby achieving satisfactory band compression.

Various modifications of the adaptive quantizer and inverse quantizer can be made. For instance, it is possible to obtain the correction quantity of the adaptive predictor directly from the output of the adaptive quantizer 10 by the use of a ROM. To be more specific, the correction quantity, which is the second term of the right side of equation (3) or (7), can be obtained by addressing a ROM with the output of the adaptive quantizer 10, i.e., the input $M_i$ of the adaptive inverse quantizer 20, together with the polarity bit of the data ($\tilde{X}_{j-i}$ or $\hat{e}_{j-i}$, i=1, 2, ..., n) stored in the filter 31 of FIG. 4 or 5. In this instance, where the input $M_i$ to the adaptive inverse quantizer is expressed in a small number of bits, inputs to the ROM, i.e., address signal lines, can be reduced. Therefore, if the correction quantity is determined in this manner, the ROM capacity can be greatly reduced.

Many and varied modifications can be devised by one skilled in the art without departing from the spirit and scope of this invention as defined in the appended claims.

What is claimed is:

1. An ADPCM system for speech or like signals comprising:

an ADPCM transmitter including a subtractor for receiving an input signal $X_j$ and predicted value and producing an output $e_j$ corresponding to the difference therebetween; a transmit adaptive quantizer for dividing the subtractor output $e_j$ by a normalization coefficient $\Delta$ which adaptively varies and for supplying as a transmitter output a quantized result of the quotient ($e_j/\Delta$) of said division in coded form; a transmit adaptive inverse quantizer for decoding the output of said transmit adaptive quantizer and for providing a transmit adaptive inverse quantizer output $\hat{e}_j$ obtained by multiplying said decoded output by said normalization coefficient; and a transmit adaptive predictor having a transmit digital filter, said digital filter having coefficients and providing said predicted value in accordance with said filter coefficients and in response to the output of said transmit adaptive inverse quantizer, the coefficients of said digital filter being corrected in accordance with a filter control signal dependent upon said decoded output; and an ADPCM receiver including a receive adaptive inverse quantizer for providing a second decoded output obtained by decoding the output of said transmitter and for providing a receive inverse quantizer output obtained by multiplying said second decoded output by said adaptively varying normalization coefficient; and a receive adaptive predictor having a receive digital filter, said receive digital filter having filter coefficients and providing a predicted value in response to said receive inverse quantizer output, the coefficients of said receive digital filter being corrected in accordance with a control signal dependent upon said second decoded output.

2. An ADPCM system as defined in claim 1, wherein said transmit adaptive quantizer comprises:
a normalizing divider for dividing said difference $e_j$ by said adaptively varying normalization coefficient $\Delta$; and
coding means for receiving the output of said transmit normalizing divider and providing a transmitter output in coded form corresponding to the value of said transmit normalizing divider output.

3. An ADPCM system as defined in claim 2, wherein said coding means quantizes the output of said normalizing divider into a plurality of discrete levels.

4. An ADPCM system as defined in claim 2, wherein said transmit adaptive inverse quantizer comprises:
decoding means for receiving the output of said coding means and providing a decoded output corresponding to $e_j/\Delta$;
a control circuit coupled to the output of said coding means and providing said adaptively varying normalization coefficient $\Delta$ in accordance with the value of said coding means output; and
multiplication means for providing an output $\hat{e}_j$ corresponding to the product of the outputs of said decoding means and control circuit.

5. An ADPCM system as defined in claim 4, wherein said transmit adaptive predictor comprises:
adding means for providing a signal $\tilde{X}_j$ corresponding to the sum of said predicted value $\tilde{X}_j$ and the output $\hat{e}_j$ of said multiplication means; and
said transmit digital filter having coefficients corrected in accordance with said filter control signal received at a filter control signal terminal, said filter control signal terminal being coupled to the output of said decoding means.

6. An ADPCM system as defined in claim 4, wherein said transmit adaptive predictor comprises said transmit digital filter having said filter coefficient corrected in accordance with a filter control signal received at a filter control signal terminal, said filter control signal terminal being coupled to the output of said decoding means, said filter receiving as its input the output $\hat{e}_j$ of said multiplication means and providing a transmit adaptive predictor output $\tilde{X}_j$.

7. An ADPCM system as defined in claim 4, wherein said transmitter further comprises:

a second subtractor for generating a quantization noise signal $N_j$ corresponding to the difference between the multiplication means output $\hat{e}_j$ and said difference $e_j$;
a second transmit digital filter having filter coefficients equal to that of said first transmit digital filter for receiving the output of said second subtractor and providing a predicted noise signal $\tilde{N}_j$; and
a third subtractor for receiving as inputs the outputs of said first and second transmit digital filters and providing to said first subtractor a predicted value $\tilde{X}_j - \tilde{N}_j$.

8. An ADPCM system as defined in any one of claims 1-5, wherein:
said adaptive inverse quantizer in said ADPCM receiver comprises a receive decoding means for receiving the output of said transmit adaptive quantizer and providing a receive decoder output $\hat{e}'_j/\Delta$ corresponding to the value of said transmit adaptive quantizer output; a receive control circuit for receiving the output of said transmit adaptive quantizer and generating a receive normalization coefficient; and a receive multiplication means for multiplying the outputs of said receive control circuit and said receive decoding means and for providing an output $\hat{e}'_j$;
wherein said receive adaptive predictor includes a receive adder for providing an output $\tilde{X}'_j$ corresponding to the sum of a receive predicted value $\tilde{X}'_j$ and $\hat{e}'_j$; and
said receive digital filter having receive digital filter coefficients corrected in accordance with a receive filter control signal applied to a receive filter control signal terminal, said receive filter control signal terminal being coupled to the output of said receive decoding means, said receive digital filter receiving the output of said receive adder and providing said receive predicted value $\tilde{X}'_j$ to said receive adder.

9. An ADPCM system as defined in any one of claims 4, 6 or 7, wherein said adaptive inverse quantizer in said ADPCM receiver includes a receive decoding means, receive control circuit and receive multiplication means connected similarly to the corresponding components in said transmit adaptive inverse quantizer, and wherein said receive adaptive predictor comprises said receive digital filter having coefficients variable in accordance with a filter control signal received at a filter control signal input terminal, said filter control signal input terminal being coupled to the output of said receive decoding means, said receive digital filter receiving the output of said receive multiplication means and providing a receive predicted value at its output; and
a receive adder for receiving and combining the output of said receive multiplication means and said receive digital filter and providing a decoded value $\tilde{X}'_j$.

* * * * *

UNITED STATES PATENT AND TRADEMARK OFFICE
CERTIFICATE OF CORRECTION

PATENT NO. : 4,354,273
DATED : October 12, 1982
INVENTOR(S) : Takashi ARASEKI and Kazunori OZAWA It is certified that error appears in the above—identified patent and that said Letters Patent is hereby corrected as shown below:

Column 5, line 2, change the equation

"$G = g\,\hat{e}_j / \sum_{i=1}^{n} \tilde{X}_{j-1}$" to

--$G = g\,\hat{e}_j / \sum_{i=1}^{n} \tilde{X}_{j-i}$ --.

Column 6, line 51, change the equation

"$B_i = B_i + g\cdot\hat{e}_j\cdot\text{sign}\,(\hat{e}_{j-1}) / \sum_{i=1}^{n} |\hat{e}_{j-i}|$ " to --$B_i = B_i + g\cdot\hat{e}_j\cdot\text{sign}\,(\hat{e}_{j-i}) / \sum_{i=1}^{n} |\hat{e}_{j-i}|$ --.

UNITED STATES PATENT AND TRADEMARK OFFICE
CERTIFICATE OF CORRECTION

PATENT NO. : 4,354,273            Page 2 of 3
DATED : October 12, 1982
INVENTOR(S) : Takashi ARASEKI and Kazunori OZAWA It is certified that error appears in the above—identified patent and that said Letters Patent is hereby corrected as shown below:

Column 7, lines 12 and 13, change the equation $$"\tilde{X}'_j = \hat{e}'_j + \hat{X}'_j$$
$$= \hat{e}'_j + B_1 \hat{e}'_{j-1} + B_2 \hat{e}'_{j-2} + \ldots + B_n \hat{e}'_{j-n} \cdot "\text{ to}$$

$$--\tilde{X}_j' = \hat{e}_j' + \hat{X}_j'$$
$$= \hat{e}_j' + B_1 \hat{e}_{j-1}' + B_2 \hat{e}_{j-2}' + \ldots + B_n \hat{e}_{j-n}' \; --.$$

line 43, first portion of the equation (10) change $$"\tilde{X}'_j = \hat{e}_j + \hat{X}_j = e_j + N_j + \hat{X}_j = X_j - \hat{X}_j + \hat{N}_j + N_j + \hat{X}_j"\text{ to}$$

$$--\tilde{X}_j' = \hat{e}_j + \hat{X}_j = e_j + N_j + \hat{X}_j = X_j - \hat{X}_j + \hat{N}_j + N_j + \hat{X}_j \; --.$$

UNITED STATES PATENT AND TRADEMARK OFFICE
CERTIFICATE OF CORRECTION

PATENT NO. : 4,354,273              Page 3 of 3
DATED : October 12, 1982
INVENTOR(S) : Takashi ARASEKI and Kazunori OZAWA It is certified that error appears in the above—identified patent and that said Letters Patent is hereby corrected as shown below:

Column 7, line 53, change the equation $$"(1 + B_1 z^{-1} + B_2 z^{-2} + \ldots + B_n z^{-N})" \text{ to}$$

$$--(1 + B_1 z^{-1} + B_2 z^{-2} + \ldots + B_n z^{-n})--.$$

Column 8, line 2, change "in" (second occurrence) to --on--.

Signed and Sealed this

Nineteenth Day of April 1983

[SEAL]

Attest:

GERALD J. MOSSINGHOFF

Attesting Officer      Commissioner of Patents and Trademarks